United States Patent
Baker

(10) Patent No.: US 8,270,907 B2
(45) Date of Patent: *Sep. 18, 2012

(54) METHOD AND SYSTEM FOR MATCHING AN INTEGRATED FM SYSTEM TO AN ANTENNA UTILIZING ON-CHIP MEASUREMENT OF REFLECTED SIGNALS

(75) Inventor: Thomas Baker, Manhattan Beach, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/080,316

(22) Filed: Apr. 5, 2011

(65) Prior Publication Data
US 2011/0183628 A1    Jul. 28, 2011

Related U.S. Application Data

(63) Continuation of application No. 11/832,468, filed on Aug. 1, 2007, now Pat. No. 7,925,220.

(51) Int. Cl.
*H04B 17/00* (2006.01)

(52) U.S. Cl. ............ 455/67.14; 455/67.11; 455/63.1; 455/280; 455/281; 455/284; 455/296; 455/78; 455/80; 455/82; 455/120; 455/121; 343/820; 343/821; 343/822; 343/702; 343/724; 343/725; 324/527

(58) Field of Classification Search ........... 455/78–83, 455/68–69, 120–125, 269, 280–281, 284, 455/296, 67.11, 67.14, 63.1, 557, 575.1, 575.7, 90.1–90.3, 344–349; 343/702, 724, 343/725, 820–822; 324/527

See application file for complete search history.

(56) References Cited

U.S. PATENT DOCUMENTS

| | | | |
|---|---|---|---|
| 7,242,917 B2 * | 7/2007 | Abbasi et al. | 455/277.1 |
| 2004/0009754 A1 * | 1/2004 | Smith, Jr. | 455/82 |
| 2005/0042989 A1 * | 2/2005 | Ho | 455/78 |
| 2005/0057404 A1 * | 3/2005 | Demicco et al. | 343/702 |
| 2006/0025088 A1 * | 2/2006 | Pietig et al. | 455/121 |

* cited by examiner

*Primary Examiner* — Tuan A Tran
(74) *Attorney, Agent, or Firm* — Thomas, Kayden, Horstemeyer & Risley, LLP

(57) ABSTRACT

Aspects of a method and system for matching an integrated system to an antenna utilizing on-chip measurement of reflected signals are provided. In a chip comprising at least a portion of a receiver and at least a portion of a transmitter, a best impedance match between an antenna and the chip may be determined based on on-chip measurement of one or more signals reflected from the antenna. The best impedance match between the antenna and the chip may be determined utilizing a correction algorithm. The correction algorithm may be determined utilizing data from an external test set that measures signals transmitted by the chip via the antenna. The reflected signals may be routed to a signal analyzer via on on-chip directional coupler. The best impedance match may be determined for each of a plurality of frequencies and/or each of a plurality of transmit signal strengths.

30 Claims, 7 Drawing Sheets

METHOD AND SYSTEM FOR MATCHING AN INTEGRATED FM SYSTEM TO AN ANTENNA UTILIZING ON-CHIP MEASUREMENT OF REFLECTED SIGNALS

CROSS-REFERENCE TO RELATED APPLICATIONS/INCORPORATION BY REFERENCE

This patent application is a continuation of U.S. patent application Ser. No. 11/832,468 filed Aug. 1, 2007.

This patent application also makes reference to:
U.S. patent application Ser. No. 11/832,598 filed on Aug. 1, 2010;
U.S. patent application Ser. No. 11/832,590 filed on Aug. 1, 2010;
U.S. patent application Ser. No. 11/832,609 filed on Aug. 1, 2010; and
U.S. patent application Ser. No. 11/832,488 filed on Aug. 1, 2010.

Each of the above stated applications is hereby incorporated herein by reference in its entirety.

FIELD OF THE INVENTION

Certain embodiments of the invention relate to wireless communication. More specifically, certain embodiments of the invention relate to a method and system for matching an integrated FM system to an antenna utilizing on-chip measurement of reflected signals.

BACKGROUND OF THE INVENTION

With the increasing popularity of various wireless standards and technologies, there is a growing demand to provide a simple and complete solution for wireless communications applications. In this regard, electronics manufacturers are increasingly attempting to incorporate multiple wireless technologies into portable electronic devices. For example, wireless technologies that are seeing widespread deployment include FM radio, Bluetooth (BT), GPS, Wi-Fi, and RFID.

Although desirable to users, incorporating multiple wireless communication technologies into devices such as wireless handsets may pose problems in terms of cost and complexity. In this regard, combining a plurality of wireless technologies into a portable electronic device may require separate processing hardware and/or separate processing software. Moreover, coordinating the reception and/or transmission of data to and/or from the portable electronic device may require significant processing overhead that may impose certain operation restrictions and/or design challenges. In this regard, integrating FM radio systems into portable devices often leads to design challenges not experienced in conventional FM radios. For example, it may be difficult to reliably and/or consistently match an FM radio to a relatively small antenna as is typically found in a portable wireless device.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for matching an integrated FM system to an antenna utilizing on-chip measurement of reflected signals, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for matching an integrated FM radio system to an antenna utilizing on-chip measurement of reflected signals. The FM radio system may comprise an integrated FM radio transmitter and a FM radio receiver.

Aspects of a method and system for matching an integrated FM radio system to an antenna utilizing on-chip measurement of reflected signals are provided. In this regard a portion of a signal output by an integrated FM radio transmit block and reflected by an antenna may be routed to an on-chip signal analyzer. Accordingly, measurements of the reflected signals may be utilized to configure a matching network in order to provide a best impedance match between the FM radio and the antenna. In this regard, a best impedance match may maximize radiation efficiency and/or radiated power. Additionally, the configuration of the matching network may incorporate a correction algorithm/offset experimentally determined via a calibration utilizing external components.

Figure 1:
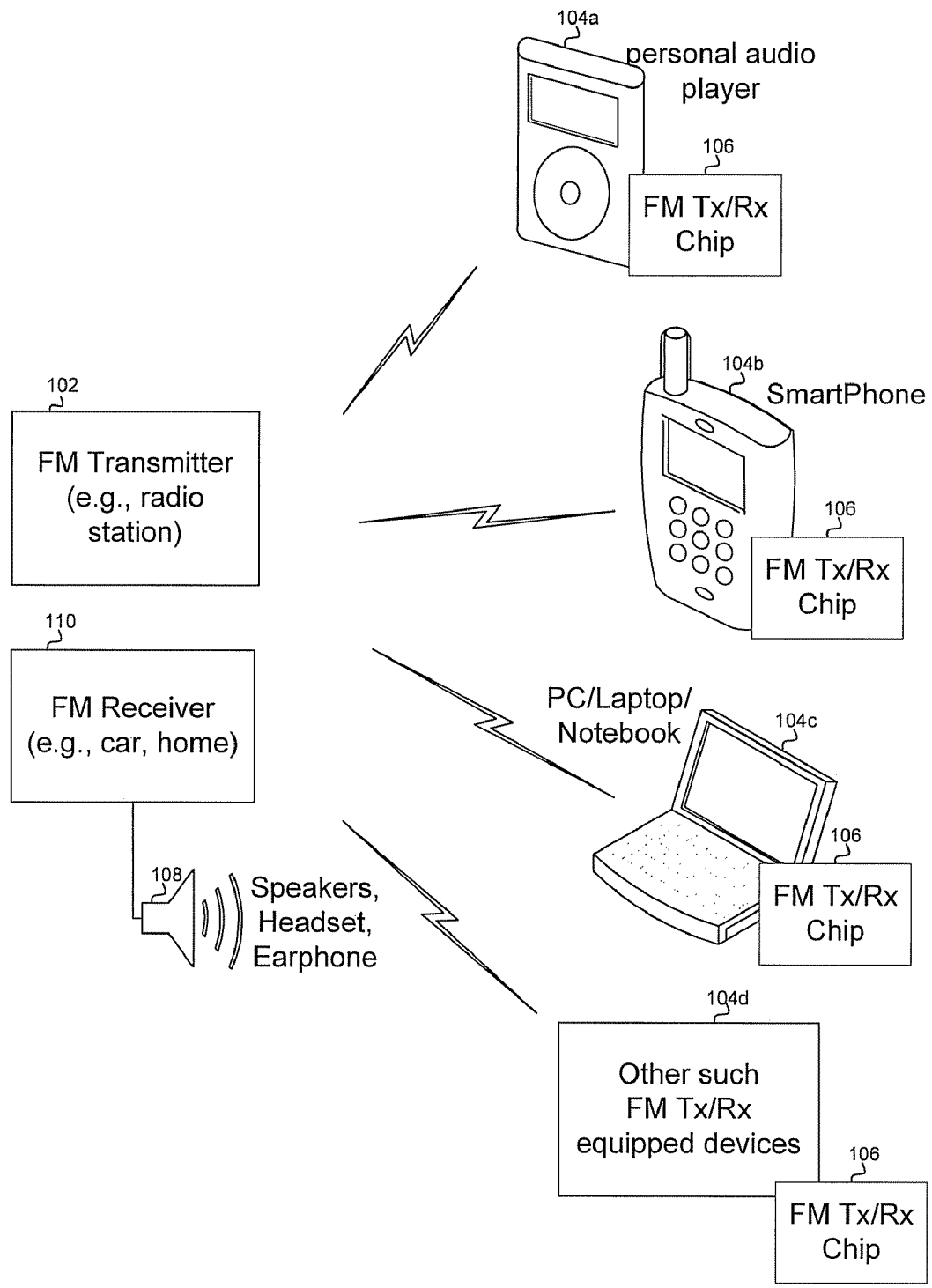
FIG. 1 is a block diagram of a plurality of handheld devices which comprise a single chip integrated FM radio system for communicating with an FM radio transmitter and/or an FM radio receiver, in accordance with an embodiment of the invention.

FIG. 1 is a block diagram of a plurality of handheld devices which comprise a single chip integrated FM radio system for communicating with an FM radio transmitter and/or an FM radio receiver, in accordance with an embodiment of the invention. Referring to FIG. 1A, there is shown an FM radio transmitter 102, an FM radio receiver 110, a personal audio player 104a, a smart phone 104b, a computer 104c, and an exemplary FM radio equipped device 104d. The FM radio transmitter 102 may be implemented as part of a radio station or other broadcasting device, for example. Each of the personal audio player 104a, the smart phone 104b, the computer 104c, and the exemplary FM radio equipped device 104d may comprise a chip 106 with integrated FM radio transmit and/or FM radio receive functions. The chip 106 may enable the devices 104 to receive FM communications from the FM radio transmitter 102. Similarly, the single chip 106 may enable transmission of FM radio communications by each of the devices 104 to the FM radio receiver 102. Each of the devices 104 may comprise an electrically small antenna that may need to be impedance to an output of the chip 106. Matching the output impedance of the chip 106 to the antenna may improve the quality of FM radio signals transmitted and/or received by the devices 104. In this regard, the chip 106 may enable transmitting, for example, a test tone and measuring a portion of the test tone reflected by the antenna. Accordingly, the chip 106 may comprise a matching network that may be programmably configured based on reflected signal measurements.

Figure 2A:
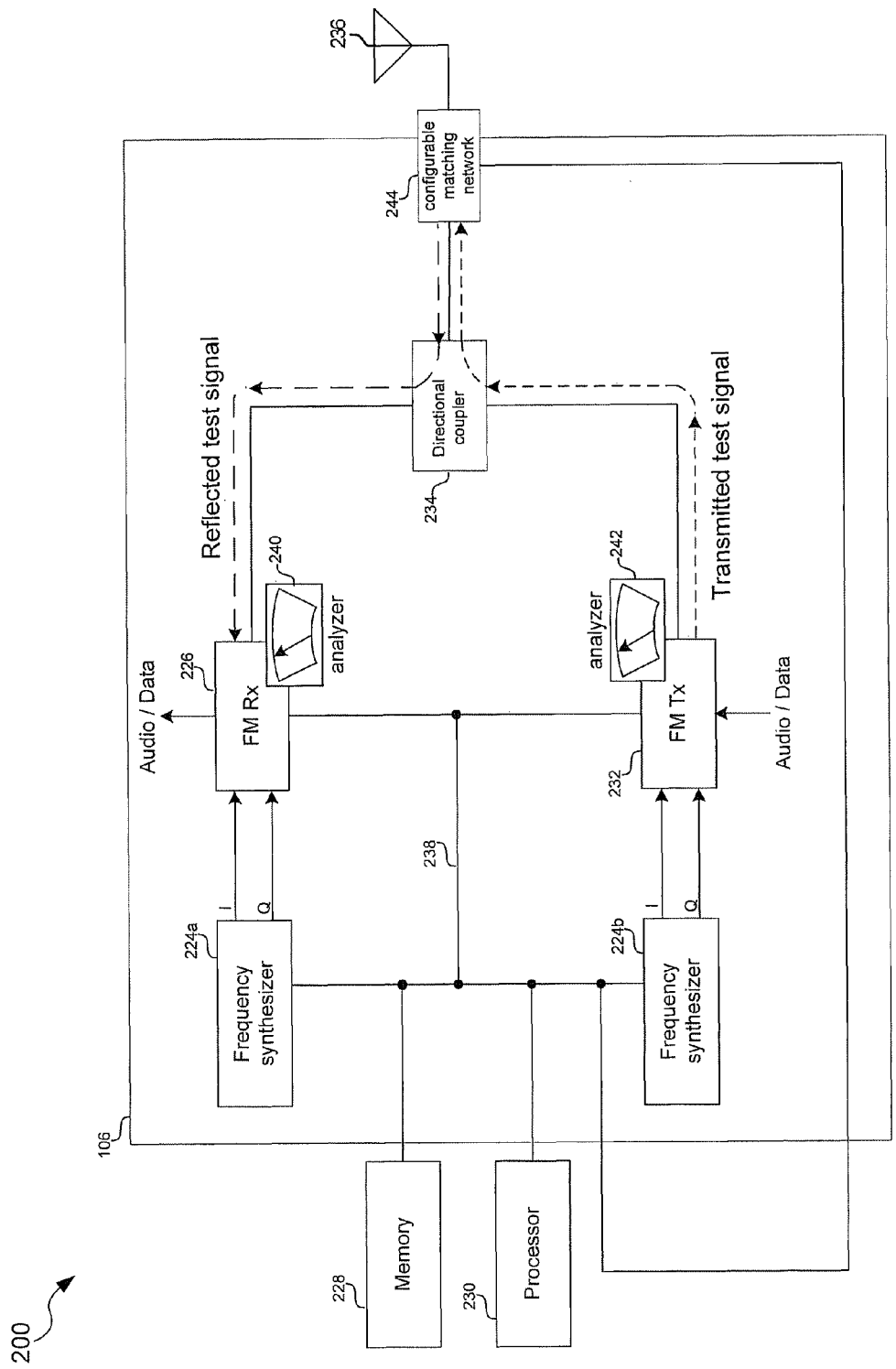
FIG. 2A is a block diagram of an exemplary system for transmission and/or reception of FM radio signals in an FM broadcast band, in accordance with an embodiment of the invention.

FIG. 2A is a block diagram of an exemplary system for transmission and/or reception of FM radio signals in an FM broadcast band, in accordance with an embodiment of the invention. Referring to FIG. 2A, the radio 200 may comprise two frequency synthesizers 224a and 224b, an FM radio receive (Rx) block 226, a memory 228, a processor 230, a directional coupler 234, an antenna 236, a FM radio transmit (Tx) block 232, and a configurable matching network 244.

The frequency synthesizers 224a and 224b may comprise suitable circuitry, logic, and/or code that may enable generation of fixed and/or variable frequency signals. For example, the frequency synthesizers 224a and 224b may each comprise one or more direct digital frequency synthesizers, and/or phase locked loops (PLLs).

The memory 228 may comprise suitable circuitry, logic, and/or code that may enable storage of information. In this regard, the memory 228 may, for example, enable storage of information utilized to control and/or configure the frequency synthesizers 224a and 224b. For example, the memory 228 may store the value of state variables that may be utilized to control the frequency output by each of the frequency synthesizers 224a and 224b. The memory 228 may enable storage of information that may be utilized to configure the FM radio Rx block 226 and/or the FM radio Tx block 232. In this regard, the FM radio Rx block 226 and/or the FM radio Tx block 232 may comprise circuitry, logic, and/or code such as a filter, for example, that may be configured based on the desired frequency of operation. The memory 228 may enable storage of information utilized for configuring the matching network 244. For example, one or more state variables may be utilized to configure a bank of capacitors via one or more switching elements. The memory 228 may enable storage of information that may be utilized to configure the signal analyzer 242 and/or the signal analyzer 240. In this regard, the signal analyzer 242 and/or the signal analyzer 240 may comprise circuitry, logic, and/or code such as a filter, for example, that may be configured based on the desired frequency for measurement. Additionally, the memory 228 may be enabled to store measurement results from the analyzer 242 and/or the signal analyzer 240.

The FM radio Rx block 226 may comprise suitable circuitry, logic, and/or code that may enable reception of FM radio signals. In this regard, the FM radio Rx block 226 may be enabled to tune to a desired channel, amplify received signals, down-convert received signals, and/or demodulate received signals to, for example, output data and/or audio information comprising the channel. For example, the FM radio Rx block 226 may utilize in-phase and quadrature phase local oscillator signals generated by the frequency synthesizer 224a to down-convert received FM radio signals. The FM radio Rx block 226 may, for example, be enabled to operate over a "FM broadcast band", or approximately 76 MHz to 108 Mhz. Signal processing performed by the FM radio Rx block 226 may be performed entirely in the analog domain, or the FM radio Rx block 226 may comprise one or more analog to digital converters and/or digital to analog converters. The FM radio Rx block 226 may comprise a signal analyzer 240. In this regard, the signal analyzer 240 may, for example, be enabled to measure the power at one or more frequencies in a received signal. In this regard, the signal analyzer 240 may comprise one or more tunable filters which may be tuned to the same frequency as the FM radio Rx block 226.

The FM radio Tx block 232 may comprise suitable circuitry, logic, and/or code that may enable transmission of FM radio signals. In this regard, the FM radio Tx block 232 may be enabled to frequency modulate a carrier signal with audio/data information. In this regard, the carrier frequency may be generated by the frequency synthesizer 224b. The FM radio Tx block 232 may also be enabled to up-convert a modulated signal to a frequency, for example, in a "FM broadcast band", or approximately 76 MHz to 108 MHz. Additionally, the FM radio Tx block 232 may be enabled to buffer and/or amplify a FM radio signal such that the signal may be transmitted via an antenna. In another embodiment of the invention, the frequency synthesizer 224a may comprise a DDFS that may be capable of providing FM radio modulation for the signal to be transmitted. The FM radio Tx block 232 may comprise a signal analyzer 242. In this regard, the signal analyzer 242 may, for example, be enabled to measure the power at one or more frequencies in a signal being transmitted. In this regard, the signal analyzer 240 may comprise one or more tunable filters which may be tuned to the same frequency as the FM radio Tx block 226.

The processor 230 may comprise suitable circuitry, logic, and/or code that may enable interfacing to the memory 228, the frequency synthesizers 224a and 224b, the FM radio Rx block 226, the FM radio Tx block 232, and/or the configurable matching network 244. In this regard, the processor 230 may be enabled to execute one or more instructions that enable reading and/or writing to/from the memory 228. The processor 230 may be enabled to execute one or more instructions that enable providing one or more control signals to the frequency synthesizer 224, the FM radio Rx block 226 and/or the FM radio Tx block 232. In this regard, the processor 230 may, for example, be enabled to tune the FM radio Rx block 226 and/or the FM radio Tx block 232 to a desired FM radio channel. The processor 230 may be enabled to execute one or more instructions that enable providing one or more control signals to the configurable matching network 244. In this regard, the processor 230 may, for example, be enabled to configure one or more switching elements comprising the configurable matching network 244. The processor 230 may be enabled to execute one or more instructions that enable providing one or more control signals to the signal analyzer 242, and/or the signal analyzer 240. In this regard, the processor 230 may, for example, be enabled to tune the signal analyzer 242, and/or the signal analyzer 240 to a desired frequency for measurement. Similarly, the processor 230 may be enable controlling measurements performed by the transmitted signal analyzer 242 and/or the received signal analyzer 240. The processor 230 may be enabled to store measurement results from the signal analyzer 242 and/or the signal analyzer 240 to the memory 228.

The directional coupler 234 may comprise suitable circuitry, logic and or code that may enable coupling the FM radio Tx block 232 and/or the FM radio Rx block 226 to the antenna 236 for the transmission and/or reception of wireless signals. The directional coupler 234 may be enabled to rout signals from the FM radio Tx block to the antenna 236 and to rout signals from the antenna 236 to the FM radio Rx block 226. In this regard, the antenna 236 may present an unmatched load and part of a signal transmitted by the FM radio Tx block 232 may be reflected by the antenna 234. Accordingly, the directional coupler 234 may route the reflected signal towards the receive path where it may be measured by the signal analyzer 240.

The configurable matching network 244 may comprise suitable logic, circuitry, and/or code that may enable matching the FM radio Rx block 226 and/or the FM radio Tx block to the antenna 236 over a range of impedances. In this regard the matching network 244 may comprise one or more active components, passive components, and/or switching elements. In one embodiment of the invention, the matching network may comprise an LC network with one or more variable capacitances and/or inductances. In this regard the variable capacitance may be a bank of capacitors configured via a number of switching elements. Similarly, the variable inductance may be a bank of inductors configured via a number of switching elements. In various embodiments of the invention, all or part of the matching network 244 may reside on-chip or off-chip. For example, one or more banks of capacitors may be realized on chip due while one or more inductances may be realized off-chip.

In an exemplary operation, one or more signals provided by the processor 230 may be utilized to configure the system 200. The processor 230 may access the memory 228 and may provide control signals to the various blocks comprising the chip 202. The frequency synthesizers 224a and 224b may be frequency locked to each other such that the FM radio Tx block 232 with corresponding signal analyzer 242, and the FM radio Rx block 226 with the corresponding signal analyzer 240 may be tuned to the same frequency. A test signal may be generated by the FM radio Tx block 232 and the test signal may be partially reflected by the antenna 236 due to an impedance mismatch between the Tx block 232 and the antenna 236.

The analyzer 240 may measure the reflected signal. The processor 230 may utilize measurements from the analyzers 240 and 242 to configure the matching network 244 such that an optimal amount of signal may be reflected from the antenna 236 at a given frequency. The configuration of the matching network may be performed at a multitude of frequencies across a "FM broadcast band". For example, for an FM radio band of 76 MHz to 108 MHz, the matching network 244 may be configured at 76 MHz, 92 MHz and 108 MHz. The configuration of the matching network may be performed utilizing a multitude of test tone signal strengths. For example, the matching network may be configured for a maximum and a minimum transmit power of the FM radio Tx block 232. The determined matching network configuration for each test frequency and/or signal strength may be stored to the memory 228.

In various embodiments of the invention, the matching network configuration determined via the reflected power measurement may incorporate a correction factor or algorithm. In this regard, electrically small FM radio antennas as found in typical portable wireless devices may exhibit significant resistive loss at certain FM frequencies and/or signal strengths. Consequently, a lack of reflected signal may result from the signal being dissipated in the antenna 236 rather than being radiated by the antenna 236. The correction factor/algorithm may be determined via actual signal measurements by an external test set. In this manner, a portable device 104 comprising the chip 106 and the antenna 236 may be calibrated experimentally in a manufacturing or prototyping environment. Accordingly, a relationship between a configuration which maximizes, for example, radiation efficiency and/or radiated power and the configuration determined utilizing the (uncorrected) reflected signal measurement may be determined.

Figure 2B:
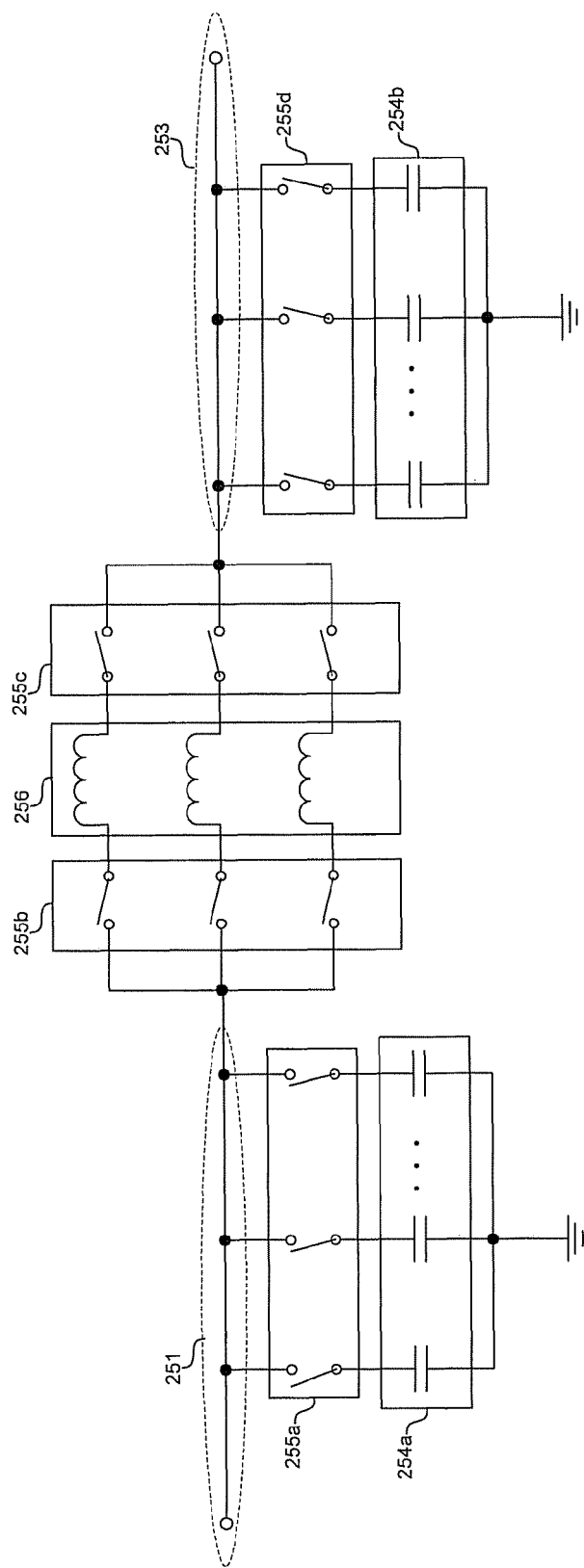
FIG. 2B is a diagram of an exemplary impedance matching network, in accordance with an embodiment of the invention.

FIG. 2B is a diagram of an exemplary impedance matching network, in accordance with an embodiment of the invention. Referring to FIG. 2B there is shown two banks of capacitors 254a and 254b with corresponding switch networks 255a, 255d, and a bank of inductors 256 with corresponding switch networks 255b and 255c. Each of the switch networks 255 may comprise a plurality of switches which may be controlled via a digital word, for example. In this regard the capacitance between node 251 and ground may be programmably controlled. Similarly the capacitance between node 253 and ground may be programmably controlled. Also, the inductance between nodes 251 and 253 may be configured. Accordingly, the matching network 244 may enable matching an output impedance of a chip such as the chip 106 to a range of antennas over a range of frequencies.

Figure 3:
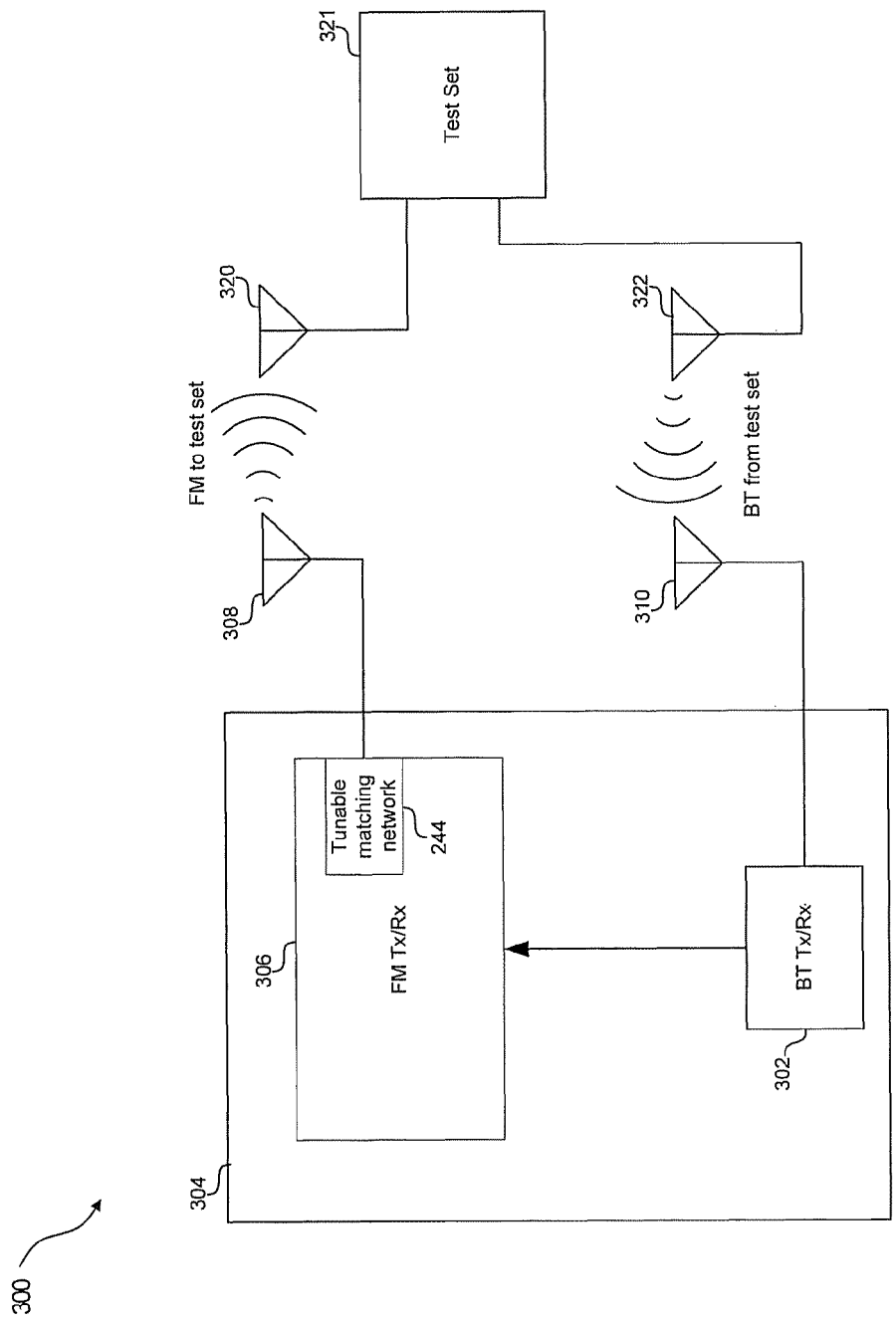
FIG. 3 is a block diagram illustrating an exemplary wireless device antenna calibration system, in accordance with an embodiment of the invention.

FIG. 3 is a block diagram of an exemplary system which utilizes an external test set to calibrate results achieved when measure reflected signals to impedance match an antenna, in accordance with an embodiment of the invention. Referring to FIG. 3, there is shown a wireless antenna configuration system 300 comprising a wireless device 304 and a test set 321. The wireless device 304 may comprise antennas 308 and 310, a FM radio Tx/Rx chip 306, and a Bluetooth transceiver 302.

The wireless device 304 may be similar to or the same as the portable devices 104 described in FIG. 1. The wireless device 304 may comprise a chip 306 similar to or the same as the chip 106 in FIG. 1 that may enable transmission and/or reception of FM radio signals in a FM broadcast Band. The wireless device 304 may also comprise a Bluetooth transceiver 302.

The Bluetooth transceiver 302 may comprise suitable logic, circuitry, and/or code that may enable reception and/or transmission of Bluetooth transmissions, processing Bluetooth signals to be received and/or transmitted, and outputting digital data. For example, the Bluetooth receiver 308 may enable reception of Bluetooth signals from the test set 321, processing of the received signals, and outputting digital instructions/data to the chip 306.

The antenna 308 may be enabled to transmit and/or receive FM radio signals, for example, over the air. The antenna 308 may be electrically small and thus accurately predicting/modeling the impedance presented by the antenna may be difficult. Accordingly, the chip 306 may comprise a configurable matching network 244 as described in FIG. 2A for impedance matching to an antenna. In various other embodiments of the invention, all or part of the matching network 244 may reside on a different substrate.

The test set 321 may comprise suitable circuitry, logic and/or code that may be enable reception of FM radio signals and measuring, for example, spectral content of received FM radio signals. In an exemplary embodiment of the invention, the test set 321 may be a calibrated system capable of determining FM frequency channels according to appropriate standards applicable to the wireless device 304. The test set 321 may comprise an antenna 320, which may be enabled to receive FM radio signals transmitted by a wireless device, such as the wireless device 304. The test set 321 may also comprise an antenna 322, which may be enabled to transmit and/or receive Bluetooth signals that may be utilized by the wireless device 304 for configuration of the chip 306. The configuration may comprise configuration of the antenna impedance matching network, for example.

In operation, commands for configuring the matching network 244 may be received via Bluetooth from the test set 321. In this regard, the test set 321 may instruct the chip 306, via Bluetooth, to transmit a test signal and cycle through a series of matching network configurations. The test set 321 may record metrics of the received test signal for each configuration of the matching network 244. Accordingly, the test set 321 may enable determining a matching network configuration which maximizes, for example, radiation efficiency and/or radiated power, for a given test signal. Additionally, the test set 321 may instruct, via for example, Bluetooth, the chip 306 to sweep a range of frequencies and/or signals strengths for the test signal such that a configuration for the matching network 244 may be determined for each frequency and/or signal strength. Upon completion of the measurements, the test set 321 may send, via for example, Bluetooth, measurement results to the chip 306 such that the determined configurations for the matching network 244 may be stored in a memory such as the memory 228 described in FIG. 2A. FIG. 3 illustrates only one example, in this case a test set 321 and a Bluetooth transceiver 302, of a calibration system which utilizes external components and/or circuitry to determine a configuration of the matching network 224 which maximizes radiation efficiency and or radiated power. Additional details regarding configuring a device via an external test set may be found in the above referenced U.S. patent application Ser. No. 11/832,609 filed on Aug. 1, 2010. In various other embodiments of the invention, measurements may be made, for example, manually utilizing an FM radio antenna and a spectrum analyzer.

Figure 4:
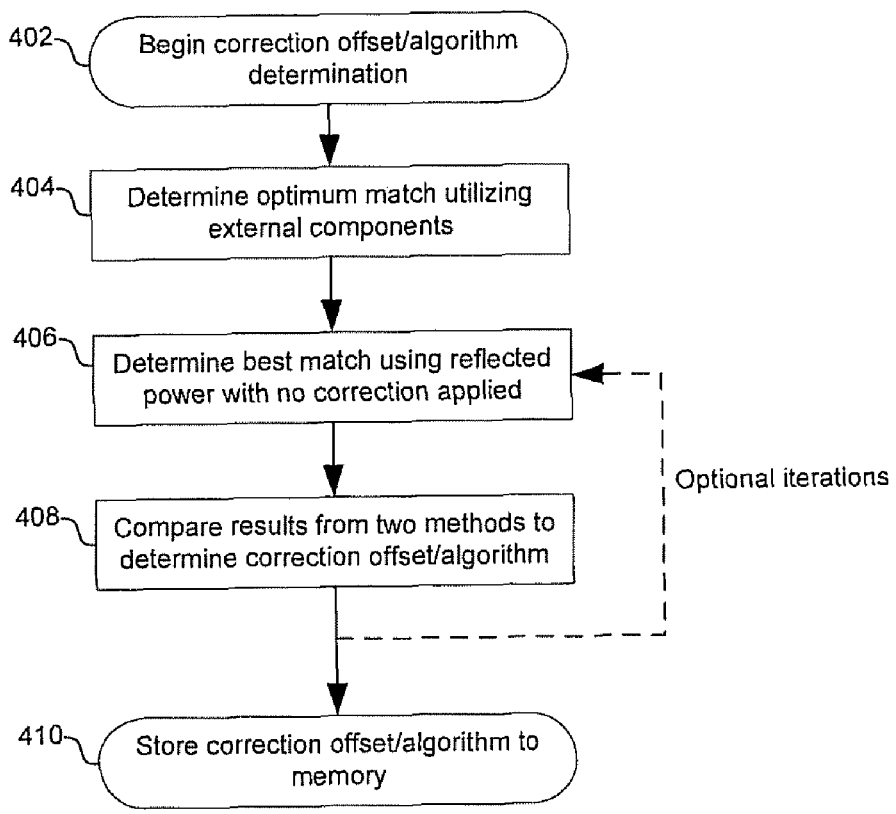
FIG. 4 illustrates exemplary steps for FM radio antenna matching utilizing on-chip reflected signal measurement, in accordance with an embodiment of the invention.

FIG. 4 illustrates exemplary steps for determining a correction offset/algorithm to apply when matching a FM radio antenna to an integrated FM radio utilizing on-chip reflected signal measurement, in accordance with an embodiment of the invention. Referring to FIG. 4 the exemplary steps may begin with a step 402 in which it is desired to determine the relationship between an experimentally determined configuration for an antenna matching network and a configuration determined utilizing on-chip reflected signal measurement. Subsequent to step 402, the exemplary steps may proceed to step 404. In step 404, a configuration of an antenna matching network which, for example, maximizes radiation efficiency and/or radiated power, may be determined utilizing external components and/or circuitry. In this regard, a setup such as the system 300 described in FIG. 3 may be utilized. Exemplary steps for determining a matching network configuration utilizing an external test set are described in FIG. 5. Subsequent to step 404, the exemplary steps may proceed to step 406.

In step 406, a configuration for an antenna matching network may be determined utilizing (uncorrected) on-chip reflected signal measurement. In this regard, an integrated FM radio system such as the system 106 may transmit a test signal and measure the signal reflected by an antenna such as the antenna 236. Exemplary steps for determining a matching network configuration utilizing on-chip reflected signal measurement are described in FIG. 6. Subsequent to step 406, the exemplary steps may proceed to step 408. In step 408, the results of steps 404 and 406 may be compared to determine a relationship between the two. Accordingly, a correction offset/algorithm may be determined such that by applying the correction during step 406 greater radiation efficiency and/or greater radiated power, for example, may be achieved than when step 406 is performed without correction. Moreover, in various embodiments of the invention, steps 406 and 408 may be performed in an iterative fashion where step 406 may be first performed with no correction, then subsequent to step 408, step 406 may be performed again, but this time with correction. In this manner, the correction offset/algorithm may be refined. Subsequent to step 408, the exemplary steps may proceed to step 410.

In step 410, data and or instructions utilized for applying the correction determined in step 408 may be stored to a memory, such as the memory 228 described in FIG. 1. In this regard, the correction may only need to be calculated once, for example, in a prototyping phase for a wireless device, such as the device 304 described in FIG. 3. In this manner, the correction offset/algorithm determined for a prototype of the device 304 may be programmed into production units of the device 304.

Figure 5:
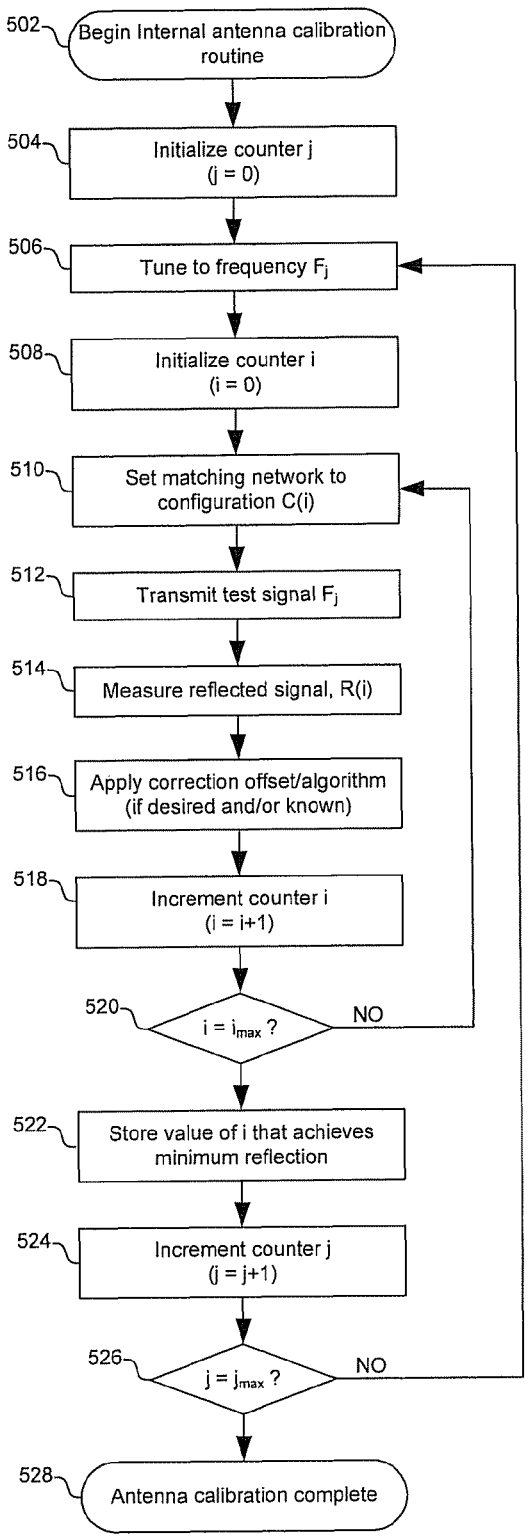
FIG. 5 illustrates exemplary steps for matching an FM radio antenna utilizing on-chip reflected signal measurement, in accordance with an embodiment of the invention.

FIG. 5 illustrates exemplary steps for matching an FM radio antenna utilizing on-chip reflected signal measurement, in accordance with an embodiment of the invention. Referring to FIG. 5 the exemplary steps may begin with a step 502, in which it is desired to best configure an antenna matching network utilizing on-chip reflected signal measurement. In this regard, a best configuration may be one which maximizes, for example, radiation efficiency and/or radiated power. Subsequent to step 502, the exemplary steps may advance to step 504. In step 504 a counter, 'j', utilized to keep track of test frequencies may be initialized. In this regard, a best configuration for an antenna matching network may depend on frequency of operation. Accordingly, a configuration may be determined for each of a multitude of frequencies. Subsequent to step 504, the exemplary steps may advance to step 506.

In step 506, the system being matched to the antenna may tune to a frequency corresponding to the value of 'j'. In the chip 106, the FM radio Tx block 232 and the FM radio Rx block 226 may each be tuned to the same frequency such that the analyzers 240 and 242 are both measuring the same frequency. Subsequent to step 506, the exemplary steps may advance to step 508. In step 508, a counter, 'i', to keep track of matching network configurations may be initialized. In this regard, each possible configuration of a matching network may be assigned a number in order to keep track of which one provides the best match. Subsequent to step 508, the exemplary steps may advance to step 510. In step 510, the matching network may be set to a configuration corresponding to the value of 'i'. Subsequent to step 510, the exemplary steps may advance to step 512. In step 512, the system being matched to the antenna may transmit a test signal at the frequency corresponding to the value of 'j'. Subsequent to step 512, the exemplary steps may advance to step 514.

In step 514, a reflected portion of the test signal is measured by a signal analyzer such as the analyzer 240 of FIG. 2A. Subsequent to step 514, the exemplary steps may advance to step 516. In step 516, a correction offset/algorithm may be applied to the measured result. In this regard, refer to FIG. 4 for a discussion of determining a correction offset/algorithm and when it may be applied. Subsequent to step 516, the exemplary steps may proceed to step 518. In step 518 the counter may be incremented. Subsequent to step 518 the exemplary steps may proceed to step 520. In step 520, it may be determined if possible configurations of the matching filter have been measured for the '$j^{th}$' test frequency. If possible configurations have not been measured for the current test frequency then the exemplary steps may return to step 510.

Returning to step 520, if possible configurations of the matching filter have been measured for the current test frequency, then the exemplary steps may proceed to step 522. In step 522, the value of corresponding to the configuration that achieved the best reflected signal result may be determined and stored. Subsequent to step 522, the exemplary steps may advance to step 524. In step 524, the counter 'j' may be incremented. Subsequent to step 524, the exemplary steps may advance to step 526. In step 526, it may be determined if all possible test frequencies have been measured. If all test frequencies have not been measured then the exemplary steps may return to the step 506.

Returning to step 526, if possible test frequencies have been measured the exemplary steps may advance to step 528 and antenna matching utilizing on-chip reflected signal measurement may be complete.

Figure 6:
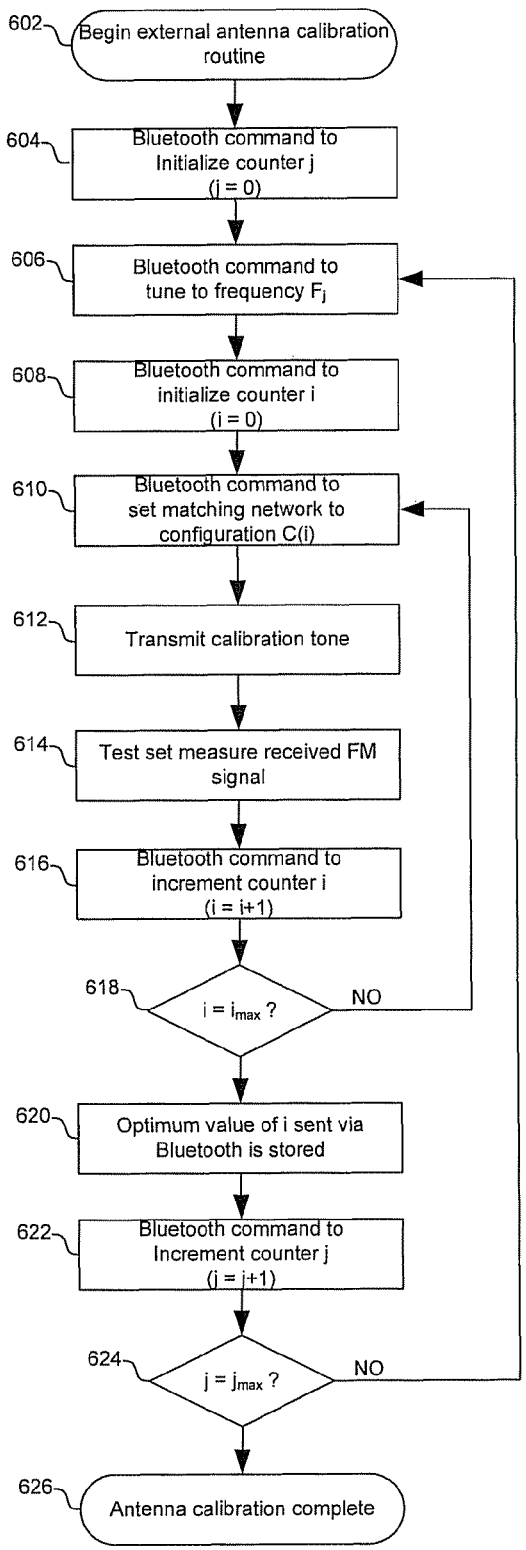
FIG. 6 illustrates exemplary steps for determining a best impedance match between an antenna and a FM radio utilizing external components and/or circuitry, in accordance with an embodiment of the invention.

FIG. 6 illustrates exemplary steps for determining a best impedance match between an antenna and a FM radio utilizing external components and/or circuitry, in accordance with an embodiment of the invention. In this regard, a best impedance match may, for example, maximize radiation efficiency and/or maximize radiated power. Referring to FIG. 6 the exemplary steps may begin with a step 602 in which it is desired to find, utilizing an external test set, an optimal configuration for an antenna matching network. Subsequent to step 602, the exemplary steps may advance to step 604. In step 604, a test set, such as the test set 321 of FIG. 3, may issue a command via Bluetooth to a wireless device, such as a device 104 of FIG. 1, to initialize a counter, 'j', utilized to keep track of test frequencies. In this regard, a best configuration for an antenna matching network may depend on frequency of operation. Accordingly, a configuration may be determined for each of a multitude of frequencies. Subsequent to step 604, the exemplary steps may advance to step 606.

In step 606, a command via Bluetooth may tune the wireless device to a frequency corresponding to the value of T. For example, in the chip 106, the FM radio Tx block 232 and the FM radio Rx block 226 may each be tuned to the same frequency such that the analyzers 240 and 242 are both measuring the same frequency. In step 608, a command via Bluetooth may initialize a counter, 'i', utilized to keep track of matching network configurations. In this regard, each possible configuration of a matching network may be assigned a number in order to keep track of which configuration provides the best match for a given frequency and/or signal strength. Subsequent to step 608, the exemplary steps may advance to step 610. In step 610, a command via Bluetooth may set the matching network to a configuration corresponding to the value of 'i'. Subsequent to step 610, the exemplary steps may advance to step 612. In step 612, the wireless device may transmit a test signal at the frequency corresponding to the value of 'j'. Subsequent to step 612, the exemplary steps may advance to step 614. In step 614, the test set may measure the test signal received from the wireless device. Subsequent to step 614, the exemplary steps may advance to step 616. In step 616, the test set may transmit a command via Bluetooth to increment the counter 'i' and thus instruct the wireless device to change the configuration of the matching network. Subsequent to step 616, the exemplary steps may advance to step 618. In step 618, it may be determined if all possible configurations of the matching filter have been measured for the 'j$^{th}$' test frequency. If possible configurations have not been measured for the current test frequency then the exemplary steps may return to step 610.

Returning to step 618, if all configurations for the matching network have been measured for the current test frequency, then the exemplary steps may advance to step 620. In step 620, the test set may determine which value of 'i' resulted in the best signal being received by the test set. Accordingly, the test set may issue a command via Bluetooth instructing the wireless device to store the best value of 'i' for the current test frequency. Subsequent to step 620, the exemplary steps may advance to step 622. In step 622, the test set may issue a command via Bluetooth to increment the counter 'j'. Subsequent to step 622, the exemplary steps may advance to step 624. In step 624 it may be determined if possible test frequencies have been measured. If possible test frequencies have not been measured then the exemplary steps may return to the step 606.

Returning to step 526, if possible test frequencies have been measured the exemplary steps may advance to step 528 and antenna matching utilizing an external test set to determine a best impedance match for FM radio signal transmission may be complete.

Aspects of a method and system for matching an integrated FM system to an antenna utilizing on-chip measurement of reflected signals are provided. In this regard a portion of a signal output by an integrated FM radio transmit block, such as the block 232 in FIG. 2A and reflected by an antenna, such as the antenna 236, may be routed to an on-chip signal analyzer, such as the analyzer 240. Accordingly, measurements of the reflected signals may be utilized to configure a matching network, such as the matching network 244, in order to provide a best impedance match between the FM radio and the antenna. In this regard, at least a portion of the matching network may reside on chip, and the matching network may comprise one or more banks of elements, such as the banks 254 of FIG. 2B, configured via one or more switches, such as the switches 255. Additionally, the configuration of the matching network may be performed by a processor such as the processor 230 of FIG. 2A, and may incorporate a correction algorithm/offset experimentally determined via a calibration utilizing external components, such as the test set 321 of FIG. 3.

Another embodiment of the invention may provide a machine-readable storage, having stored thereon, a computer program having at least one code section executable by a machine, thereby causing the machine to perform the steps as described herein for matching an integrated FM radio system to an antenna utilizing on-chip measurement of reflected signals.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with, reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method comprising:
in a chip comprising at least a portion of a receiver and at least a portion of a transmitter:
determining a best impedance match between an antenna and said chip based on on-chip measurement of one or more signals reflected from said antenna, wherein:
said best impedance match between said antenna and said chip is determined utilizing a correction algorithm; and
said correction algorithm is determined utilizing data from an external test set that measures signals transmitted by said chip via said antenna.

2. The method according to claim 1, comprising routing, utilizing an on-chip directional coupler, said reflected signals to a signal analyzer.

3. The method according to claim 2, wherein said signal analyzer measures signal strength of said one or more signals reflected from said antenna.

4. The method according to claim 1, comprising impedance matching said antenna and said chip utilizing a configurable matching network.

5. The method according to claim 4, wherein at least a portion of said configurable matching network is integrated on said chip.

6. The method according to claim 4, wherein said configurable matching network comprises one or more banks of inductors communicatively coupled via one or more switching elements.

7. The method according to claim 4, wherein said configurable matching network comprises one or more banks of capacitors communicatively coupled via one or more switching elements.

8. The method according to claim 1, wherein said best impedance match is determined for each of a plurality of frequencies.

9. The method according to claim 1, wherein said best impedance match is determined for each of a plurality of transmit signal strengths.

10. The method according to claim 1, wherein said external test set provides control signals to said chip utilizing one or more wireless protocols other than a wireless protocol of said one or more signals reflected from said antenna.

11. A system comprising:
one or more circuits in a chip, said one or more circuits comprising at least a portion of a receiver and at least a portion of a transmitter, and said one or more circuits being operable to:
determine a best impedance match between an antenna and said chip based on on-chip measurement of one or more signals reflected from said antenna, wherein:
said best impedance match between said antenna and said chip is determined utilizing a correction algorithm; and
said correction algorithm is determined utilizing data from an external test set that measures signals transmitted by said chip via said antenna.

12. The system according to claim 11, wherein:
said one or more circuits comprise a directional coupler; and
said reflected signals are routed to a signal analyzer by said directional coupler.

13. The system according to claim 12, wherein said signal analyzer measures signal strength of said one or more signals reflected from said antenna.

14. The system according to claim 11, wherein said one or more circuits configure a configurable matching network as part of said determining said best impedance.

15. The system according to claim 14, wherein at least a portion of said configurable matching network is integrated on said chip.

16. The system according to claim 14, wherein said configurable matching network comprises one or more banks of inductors communicatively coupled via one or more switching elements.

17. The system according to claim 14, wherein said configurable matching network comprises one or more banks of capacitors communicatively coupled via one or more switching elements.

18. The system according to claim 11, wherein said best impedance match is determined for each of a plurality of frequencies.

19. The system according to claim 11, wherein said best impedance match is determined for each of a plurality of transmit signal strengths.

20. The system according to claim 11, wherein said external test set provides control signals to said chip utilizing one or more wireless protocols other than a wireless protocol of said one or more signals reflected from said antenna.

21. A non-transitory computer-readable medium embodying a program executable in a computing device, the program designed to determine a best impedance match between an antenna and a chip based on an on-chip measurement of one or more signals reflected from the antenna, wherein the best impedance match between the antenna, and the chip is determined utilizing a correction algorithm the correction algorithm is determined utilizing data from an external test set that measures signals transmitted by the chip via the antenna.

22. The non-transitory computer-readable medium of claim 21, further comprising code that routes, utilizing an on-chip directional coupler, the reflected signals to a signal analyzer.

23. The non-transitory computer-readable medium of claim 22, wherein the signal analyzer measures signal strength of the one or more signals reflected from the antenna.

24. The non-transitory computer-readable medium of claim 21, further comprising code that impedance matches the antenna and the chip utilizing a configurable matching network.

25. The non-transitory computer-readable medium of claim 24, wherein at least a portion of the configurable matching network is integrated on the chip.

26. The non-transitory computer-readable medium of claim 24, wherein the configurable matching network comprises one or more banks of inductors communicatively coupled via one or more switching elements.

27. The non-transitory computer-readable medium of claim 24, wherein the configurable matching network comprises one or more banks of capacitors communicatively coupled via one or more switching elements.

28. The non-transitory computer-readable medium of claim 21, wherein the best impedance match is determined for each of a plurality of frequencies.

29. The non-transitory computer-readable medium of claim 21, wherein the best impedance match is determined for each of a plurality of transmit signal strengths.

30. The non-transitory computer-readable medium of claim 21, wherein the external test set provides control signals to the chip utilizing one or more wireless protocols other than a wireless protocol of the one or more signals reflected from the antenna.

* * * * *